(12) United States Patent
Kim

(10) Patent No.: US 9,899,400 B2
(45) Date of Patent: Feb. 20, 2018

(54) SEMICONDUCTOR DEVICE AND METHOD OF MANUFACTURING THE SAME

(71) Applicant: SK hynix Inc., Icheon-si, Gyeonggi-do (KR)

(72) Inventor: Do Youn Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/230,676

(22) Filed: Aug. 8, 2016

(65) Prior Publication Data

US 2017/0236831 A1   Aug. 17, 2017

(30) Foreign Application Priority Data

Feb. 17, 2016   (KR) .................. 10-2016-0018334

(51) Int. Cl.
| | |
|---|---|
| *H01L 21/311* | (2006.01) |
| *H01L 27/11556* | (2017.01) |
| *H01L 21/28* | (2006.01) |
| *H01L 27/11519* | (2017.01) |
| *H01L 27/11565* | (2017.01) |
| *H01L 27/11582* | (2017.01) |

(52) U.S. Cl.
CPC .. *H01L 27/11556* (2013.01); *H01L 21/28273* (2013.01); *H01L 21/28282* (2013.01); *H01L 21/31105* (2013.01); *H01L 27/11519* (2013.01); *H01L 27/11565* (2013.01); *H01L 27/11582* (2013.01)

(58) Field of Classification Search
None
See application file for complete search history.

(56) References Cited

U.S. PATENT DOCUMENTS

| | | | | |
|---|---|---|---|---|
| 2012/0276696 A1* | 11/2012 | Yang | ................ | H01L 27/11556 438/156 |
| 2013/0089974 A1* | 4/2013 | Lee | .................. | H01L 27/11556 438/510 |
| 2016/0043093 A1* | 2/2016 | Lee | .................. | H01L 27/11521 257/314 |

FOREIGN PATENT DOCUMENTS

KR   1020140117212 A   10/2014

* cited by examiner

*Primary Examiner* — Reema Patel
*Assistant Examiner* — Steven Christopher
(74) *Attorney, Agent, or Firm* — William Park & Associates Ltd.

(57) ABSTRACT

A semiconductor device and a method of manufacturing a semiconductor device may be provided. The semiconductor device may include first channel layers arranged in a first direction. The semiconductor device may include second channel layers adjacent to the first channel layers in a second direction crossing the first direction and arranged in the first direction. The semiconductor device may include insulating layers stacked while surrounding side walls of the first and second channel layers. The semiconductor device may include conductive layers interposed between the insulating layers, and including first metal patterns extended in the first direction and second metal patterns extended in the first direction while surrounding the side walls of the first channel layers.

20 Claims, 15 Drawing Sheets

B-B'

B-B'

B-B'

B-B'

SEMICONDUCTOR DEVICE AND METHOD OF MANUFACTURING THE SAME

CROSS-REFERENCE TO RELATED APPLICATION

The present application claims priority under 35 U.S.C. § 119(a) to Korean patent application number 10-2016-0018334 filed on Feb. 17, 2016, in the Korean Intellectual Property Office, the entire disclosure of which is incorporated herein by reference.

BACKGROUND

1. Technical Field

The present disclosure may generally relates to an electronic device and a method of manufacturing the electronic device, and more particularly, to a three-dimensional semiconductor device and a method of manufacturing the three-dimensional semiconductor device.

2. Related Art

A non-volatile memory device is a memory device in which stored data is maintained even though the power supply is blocked. Recently, improvements on the degree of integration for a two-dimensional (2D) memory device, in which a memory cell is formed in a single layer on a silicon substrate, has reached a limit. Thus, a three-dimensional (3D) non-volatile memory device, in which a plurality of memory cells is vertically stacked on a substrate, has been suggested.

The 3D non-volatile memory device includes interlayer insulating layers and gate electrodes, which are alternately stacked, and channel layers passing through the interlayer insulating layers and the gate electrodes. Memory cells are stacked along the channel layers. Further, during the process of manufacturing the 3D non-volatile memory device, the stacked gate electrodes are formed by alternately stacking the plurality of oxide layers and the plurality of nitride layers. Then the plurality of nitride layers is replaced with the plurality of conductive layers.

However, there is a problem in that the difficulty of the process of replacing the plurality of nitride layers with the plurality of conductive layers is high. Particularly, reaction gas is left in a stacked material during the process of replacing the plurality of nitride layers with the plurality of conductive layers. As a result, peripheral layers are damaged by the left reaction gas, and thus, a characteristic of the memory device is degraded.

SUMMARY

An example of an embodiment of the present disclosure may provide a method of manufacturing a semiconductor device. The semiconductor device may include first channel layers arranged in a first direction. The semiconductor device may include second channel layers adjacent to the first channel layers in a second direction crossing the first direction and arranged in the first direction. The semiconductor device may include insulating layers stacked while surrounding side walls of the first and second channel layers. The semiconductor device may include conductive layers interposed between the insulating layers, and including first metal patterns extended in the first direction and second metal patterns extended in the first direction while surrounding the side walls of the first channel layers.

DETAILED DESCRIPTION

Figure 1A:
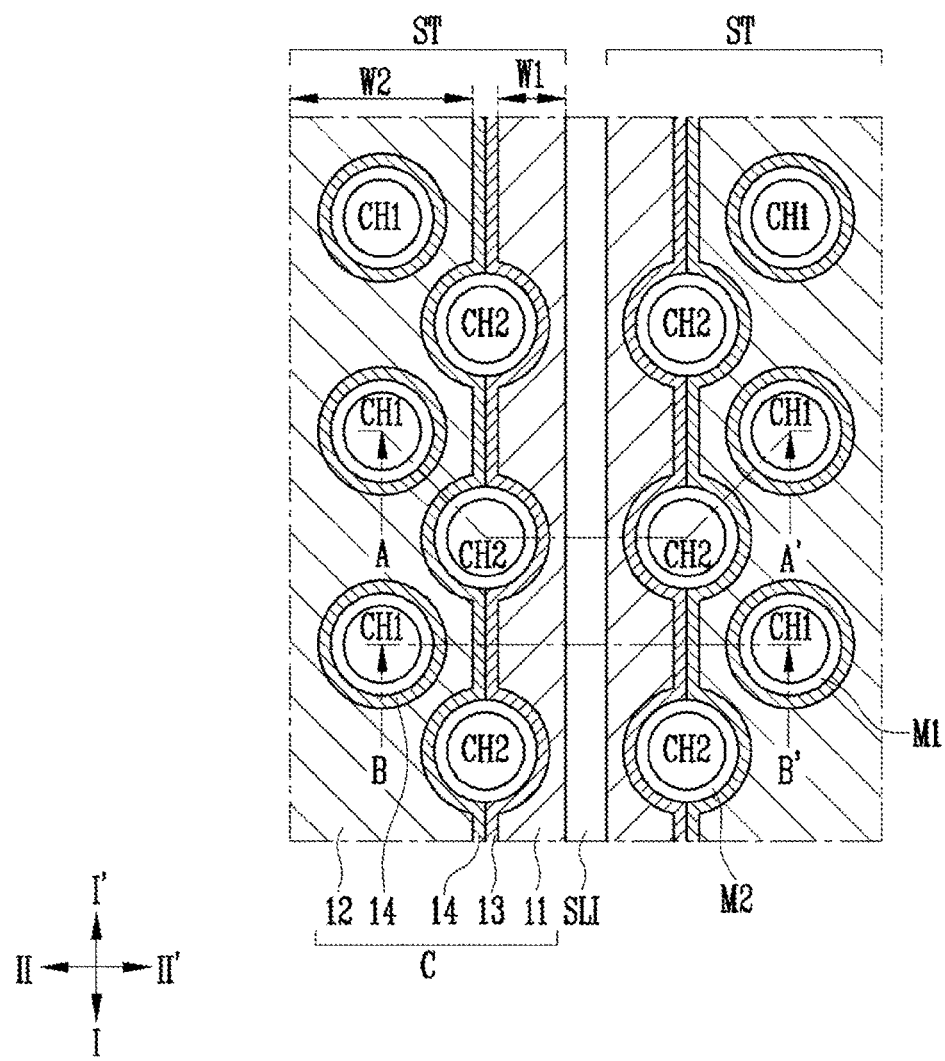
FIGS. 1A and 1B are layout views for describing a structure of a semiconductor device according to an example of an embodiment of the present disclosure.

Hereinafter, examples of embodiments of the present disclosure will be described. In the drawings, the thicknesses and the intervals of elements are exaggerated for convenience of illustration, and may be exaggerated compared to an actual physical thickness. In describing the present disclosure, a publicly known configuration irrelevant to the principal point of the present disclosure may be omitted. It should be noted that in giving reference numerals to elements of each drawing, like reference numerals refer to like elements even though like elements are illustrated in different drawings.

Examples of embodiments will be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Various embodiments may provide for a semiconductor device and a method of manufacturing the semiconductor device, of which a manufacturing process is easy and has a stable structure and characteristic to address the limitations discussed above.

Figure 1B:
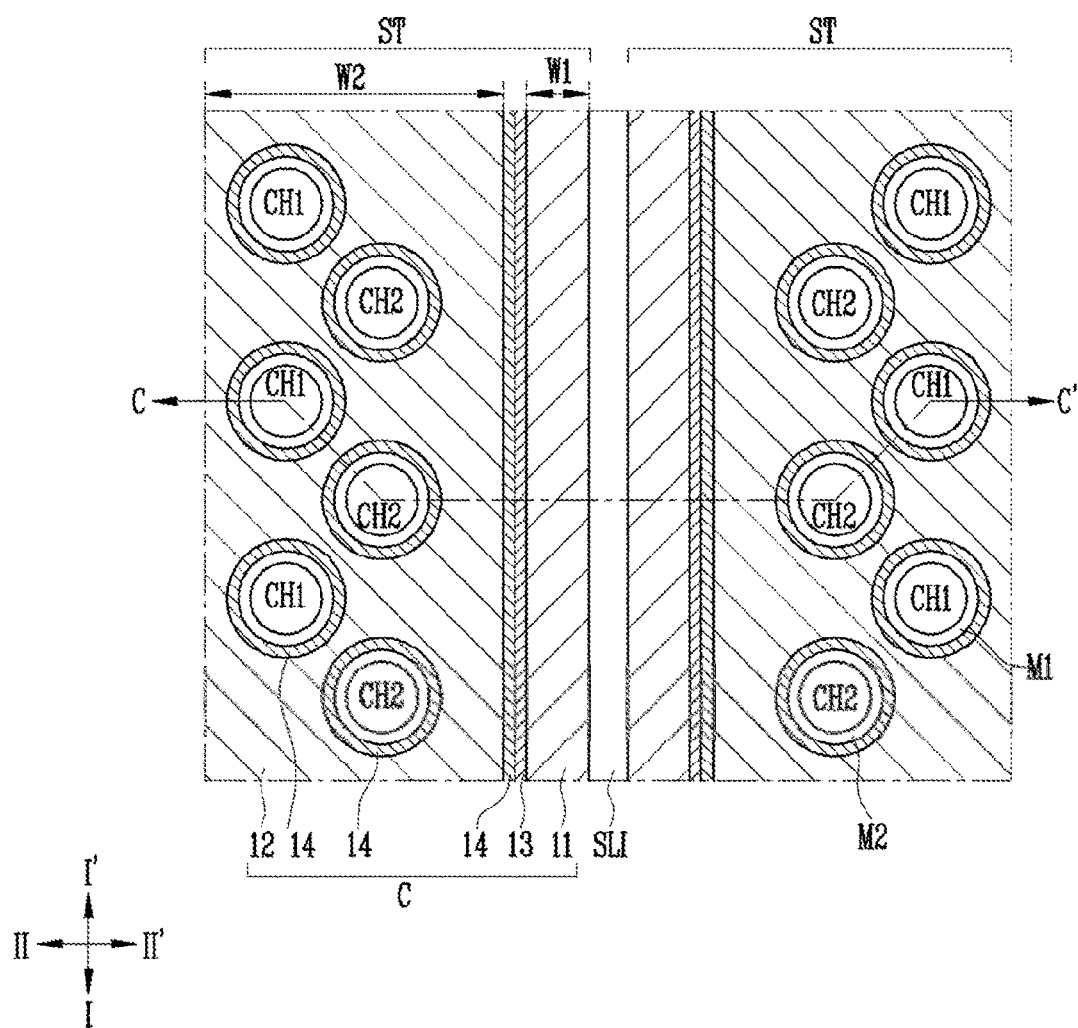

FIGS. 1A and 1B are layout views for describing a structure of a semiconductor device according to an example of an embodiment of the present disclosure.

Referring to FIGS. 1A and 1B, a semiconductor device according to an example of an embodiment of the present disclosure includes stacked materials, in which insulating layers (not illustrated) and conductive layers C are alternately stacked, and a slit insulating layer SLI is positioned between the stacked materials ST. The conductive layers C and the slit insulating layer SLI are extended in a first direction I-I', and the conductive layers C, which are adjacent in a second direction II-II' by the slit insulating layer SLI, are insulated from each other.

First channel layers CH1 are arranged in the first direction I-I' to configure one channel column, and second channel layers CH2 are arranged in the first direction I-I' to configure one channel column. Each of the channel columns is extended in the first direction I-I'. Further, the first and second channel layers CH1 and CH2 pass through the stacked materials ST in a stack direction, and two or more channel columns are positioned within one stacked material ST.

The first channel layers CH1 and the second channel layers CH2 are adjacent in the second direction II-II' crossing the first direction I-I'. The first channel layers CH1 and the second channel layers CH2 may be arranged so that centers thereof are matched in the second direction II-II', or are mismatched. In the drawing, a case where the first channel layers CH1 and the second channel layers CH2 are alternately arranged in a zigzag form is illustrated.

The second channel layers CH2 are positioned to be relatively close to the slit insulating layer SLI, and the first channel layers CH1 are positioned to be relatively far from the slit insulating layer SLI. For example, the channel layers positioned just next to the slit insulating layer SL1 among the channel layers CHI1 and CHI2 may be the second channel layers CH2.

Each of the conductive layers C may include a first metal pattern 11, which is in contact with the slit insulating layer SLI and is extended in the first direction I-I', and a second metal pattern 12, which is electrically connected with the first metal pattern 11 and is extended in the first direction I-I'. Further, each of the conductive layers C may include may include a first barrier pattern 13 surrounding the first metal pattern 11 and a second barrier pattern 14 surrounding the second metal pattern 12. Accordingly, the first metal pattern 11 and the second metal pattern 12 may be electrically connected through the first and second barrier patterns 13 and 14.

For example, the first barrier pattern 13 may be formed to surround a side wall, an upper surface, and a lower surface of the first metal pattern 11, except for a contact surface with the slit insulating layer SLI, and may substantially have a form of "C". Further, the second barrier pattern 14 may be formed to surround a whole surface of the second metal pattern 12.

Further, memory layers M1 and M2 are interposed between the first and second channel layers CH1 and CH2 and the conductive layers C. For example, the memory layers M1 and M2 surround side walls of the first and second channel layers CH1 and CH2, and are interposed between the first and second channel layers CH1 and CH2 and the first and second barrier patterns 13 and 14. The memory layers M1 and M2 may include at least one of a tunnel insulating layer, a data storing layer, and a charge blocking layer, and the data storing layer may include a floating gate, such as polysilicon, a charge trap material, such as a nitride, a phase change material, a nano dot, and the like.

According to an example of an embodiment of the present disclosure, a conductive material is filled between a channel hole and a slit, so that the conductive material is filled in both directions (i.e., from both the channel hole and the slit) during a process of replacing the stacked sacrificial layers with the conductive layers C. Accordingly, the first metal pattern 11 and the second metal pattern 12 may have the same width (W1=W2) or different widths (W1>W2, W1<W2) according to the amount of conductive material filled in both directions.

Referring to FIG. 1A, the first metal pattern 11 is extended in the first direction I-I' while surrounding partial side walls of the second channel layers CH2, and the second metal pattern 12 is extended in the first direction I-I' while surrounding side walls of the first channel layers CH1 and the side walls of the remaining second channel layers CH2. Accordingly, the side wall of each of the second channel layers CH2 is surrounded by the first and second metal patterns 11 and 12, and the side wall of each of the first channel layers CH1 is surrounded by the second metal patterns 12.

The first barrier pattern 13 surrounds partial side walls of the second channel layers CH2 and is interposed between the first metal pattern 11 and the second metal pattern 12. The second barrier pattern 14 surrounds side walls of the first channel layers CH1 and the side walls of the remaining channel layers CH2, and is interposed between the second metal pattern 12 and the first barrier pattern 13.

The first memory layer M1 surrounds the side wall of the first channel layer CH1, and is interposed between the first channel layer CH1 and the second barrier patterns 14. The second memory layer M2 surrounds the side wall of the second channel layer CH2, and is interposed between the second channel layer CH2 and the first barrier pattern 13, and between the second channel layer CH2 and the second barrier pattern 14.

Referring to FIG. 1B, the second metal pattern 12 surrounds the side walls of the first channel layers CH1 and the second channel layers CH2, and is extended in the first direction I-I'. The first metal pattern 11 is interposed between the second metal pattern 12 and the slit insulating layer SLI, and is extended in the first direction I-I' while being in contact with the slit insulating layer SLI. Further, the first barrier pattern 13 surrounds the first metal pattern 11, and the second barrier pattern 14 surrounds the side walls of the first channel layers CH1 and the second channel layers CH2.

The first memory layer M1 surrounds the side wall of the first channel layer CH1, and is interposed between the first channel layer CH1 and the second barrier patterns 14. The second memory layer M2 surrounds the side wall of the second channel layer CH2, and is interposed between the second channel layer CH2 and the second barrier patterns 14.

According to an aforementioned structure, the conductive material, particularly, a metal material, may be completely filled between the stacked insulating layers, so that it is possible to decrease resistance values of the conductive layers C. Accordingly, loading of the memory device is improved. The first and second barrier patterns 13 and 14 are interposed between the first metal pattern 11 and the second metal pattern 12, so that it is possible to form the conductive layers C having a firm structure by increasing adhesive force between the first metal pattern 11 and the second metal pattern 12. The first and second barrier patterns 13 and 14 are interposed between the first and second memory layers M1 and M2 and the first and second metal patterns 11 and 12, so that it is possible to prevent the first and second memory layers M1 and M2 from being in direct contact with the first and second metal patterns 11 and 12 and being degraded.

FIGS. 2A to 2G and FIGS. 3A to 3G are diagrams for describing a method of manufacturing the semiconductor device according to an example of an embodiment of the present disclosure, and FIGS. 2A to 2G are cross-sectional views taken along line A-A' of FIG. 1A, and FIGS. 3A to 3G are cross-sectional views taken along line B-B' of FIG. 1A.

Figure 2A:
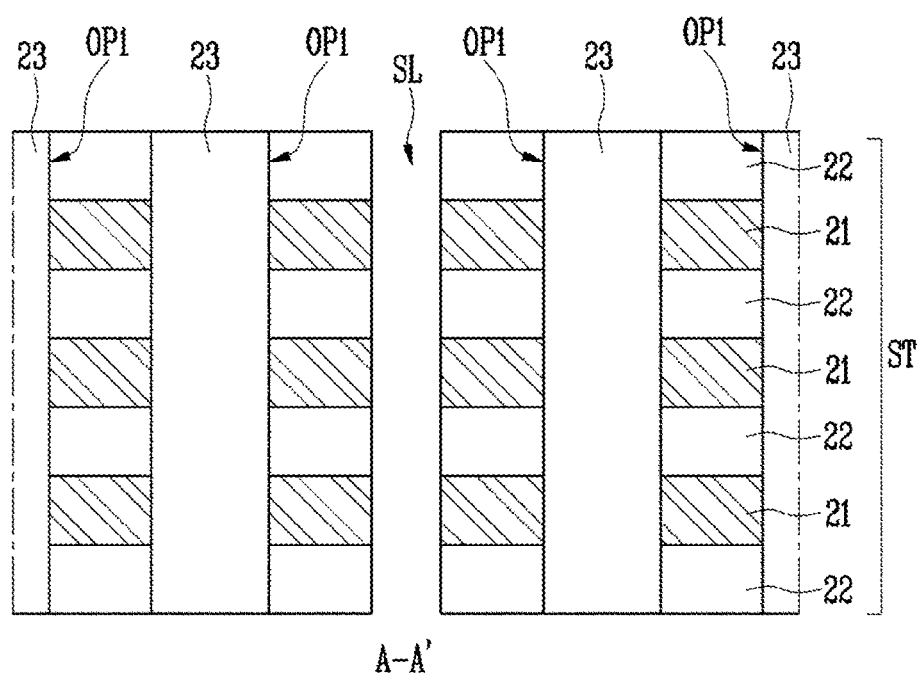
FIGS. 2A to 2G and FIGS. 3A to 3G are diagrams for describing a method of manufacturing the semiconductor device according to an example of an embodiment of the present disclosure.
Figure 3A:
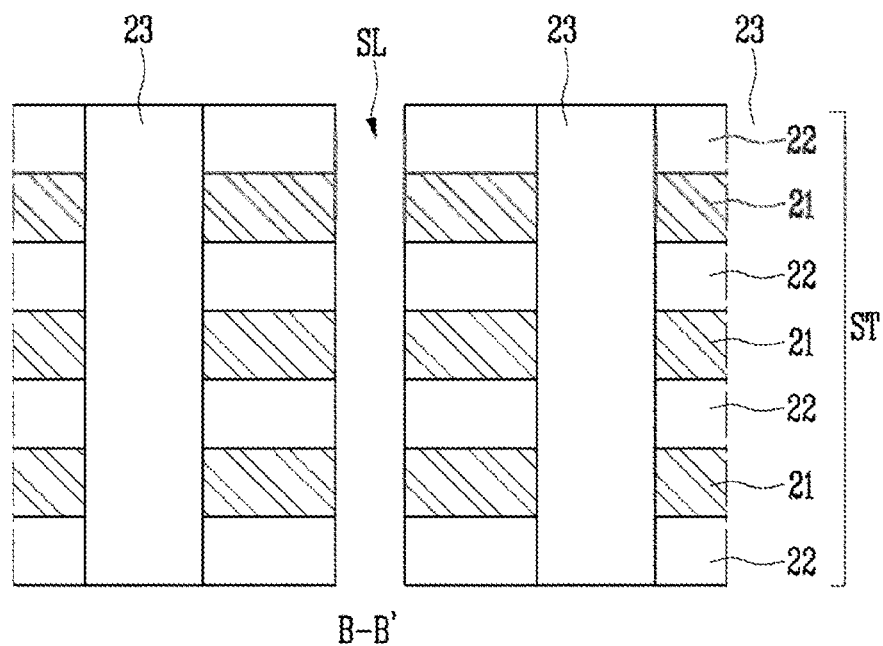

Referring to FIGS. 2A and 3A, a stacked material ST, in which first material layers 21 and second material layers 22 are alternately stacked, is formed. Here, the purpose of the first material layers 21 may be to form a gate electrode of a memory cell, a select transistor, and the like, and the purpose of the second material layers 22 may be to form an insulating layer for insulating the stacked gate electrodes from each other. The first material layers 21 are formed of a material having a high etch selectivity with respect to the second material layers 22. For example, the first material layer 21 may be a sacrificial layer including a nitride, and the second material layer 22 may be an insulating layer including an oxide. For example, the first material layer 21 may be a first sacrificial layer, and the second material layer 22 may be a second sacrificial layer. Hereinafter, a case where the first material layer 21 is a sacrificial layer and the second material layer 22 is an insulating layer will be described.

Next, first openings OP1, which pass through the first and second material layers 21 and 22 and are arranged in the first direction I-I' and the second direction II-II', are formed. Here, the first openings OP1 may be channel holes for forming a channel layer in a subsequent process. Sacrificial layers 23 are formed within the first openings OP1.

Next, a slit SL passing through the first and second material layers 21 and 22 is formed. Here, the slit SL may have a form of a line extended in the first direction I-I', or the slits SL in a form of a bar may be arranged in the first direction I-I'. The slit SL may be formed in a depth, by which all of the stacked first material layers 21 are exposed.

Figure 2B:
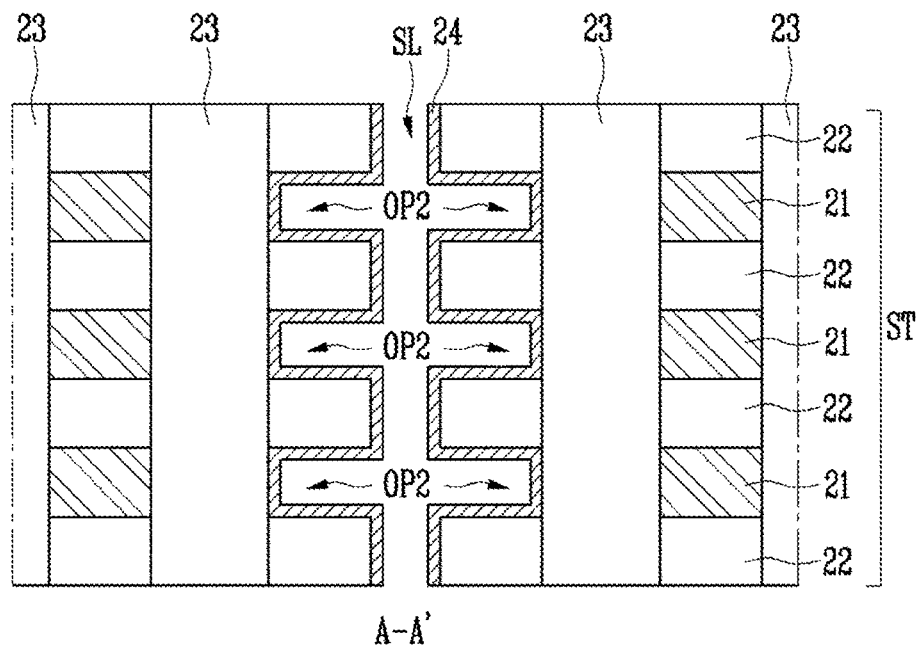
Figure 3B:
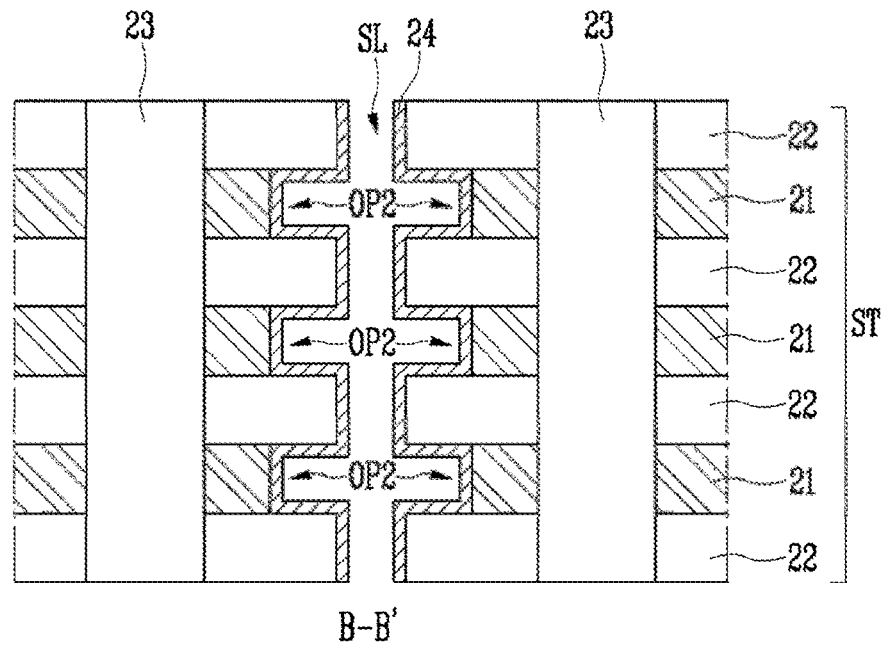

Referring to FIGS. 2B and 3B, second openings OP2 are formed by partially removing the first material layers 21 exposed through the slit SL. In this case, the sacrificial layers 23 positioned to be adjacent to the slit SL may be exposed or may not be exposed according to the amount of first material layers 21 removed. In the present example of an embodiment, a case where the first materials 21 are partially removed so that the sacrificial layers 23 adjacent to the slit SL are not exposed will be described.

Next, first barrier layers 24 are formed along internal surfaces of the second openings OP2 and the slit SL. Here, the first barrier layers 24 may be formed in a thickness, in which the second openings OP2 are not completely filled. Further, the first barrier layers 24 may be formed along the surfaces of the insulating layers 22 and the surfaces of the sacrificial layers 23 exposed through the openings OP2 and the slit SL. For example, the first barrier layers 24 may include titanium (Ti), a titanium nitride (TiN), tantalum (Ta), a tantalum nitride (TaN), a tungsten nitride (WNx), or a tungsten silicon nitride (WSiN).

Figure 2C:
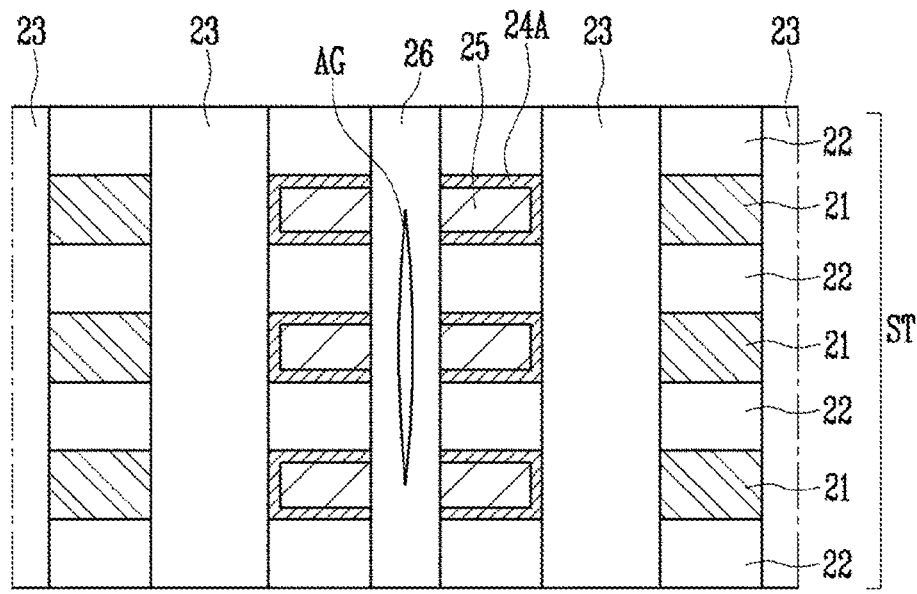
Figure 3C:
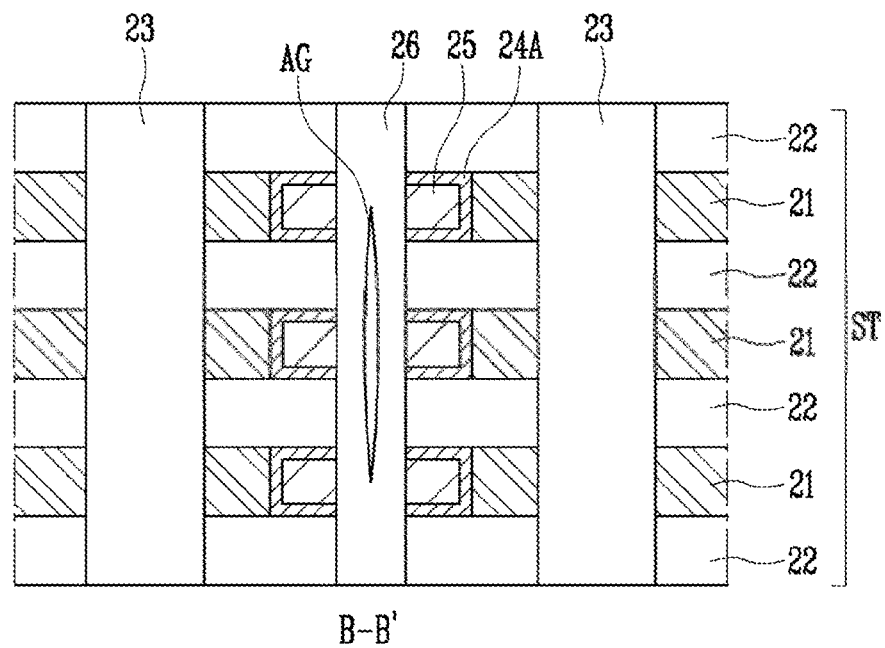

Referring to FIGS. 2C and 3C, first barrier patterns 24A and first metal patterns 25 are formed within the second openings OP2. Here, the first metal patterns 25 may include aluminum Al, tungsten W, or copper Cu.

For example, the first barrier patterns 24A are formed within the second openings OP2, respectively, by removing the first barrier layer 24 formed within the slit SL by a blanket etching process, and then the first metal patterns 25 are formed. For an example, after a first metal layer is formed within the second openings OP2 and the slit SL, and then the first metal patterns 25 and the first barrier patterns 24A are formed by removing the first metal layer and the first barrier layer 24 formed within the slit SL. The first metal patterns 25 and the first barrier patterns 24A, which are vertically stacked, are insulated from each other by the second material layers 22. Further, the first barrier patterns 24A surround the first metal patterns 25 in substantially a form of "C", respectively. Accordingly, some of the first material layers 21 are replaced with the first metal patterns 25 and the first barrier patterns 24A.

Subsequently, a slit insulating layer 26 is formed within the slit SL. When an aspect ratio of the stacked material ST is large, an empty space, for example, an air gap AG, may be included in the slit insulating layer 26.

Figure 2D:
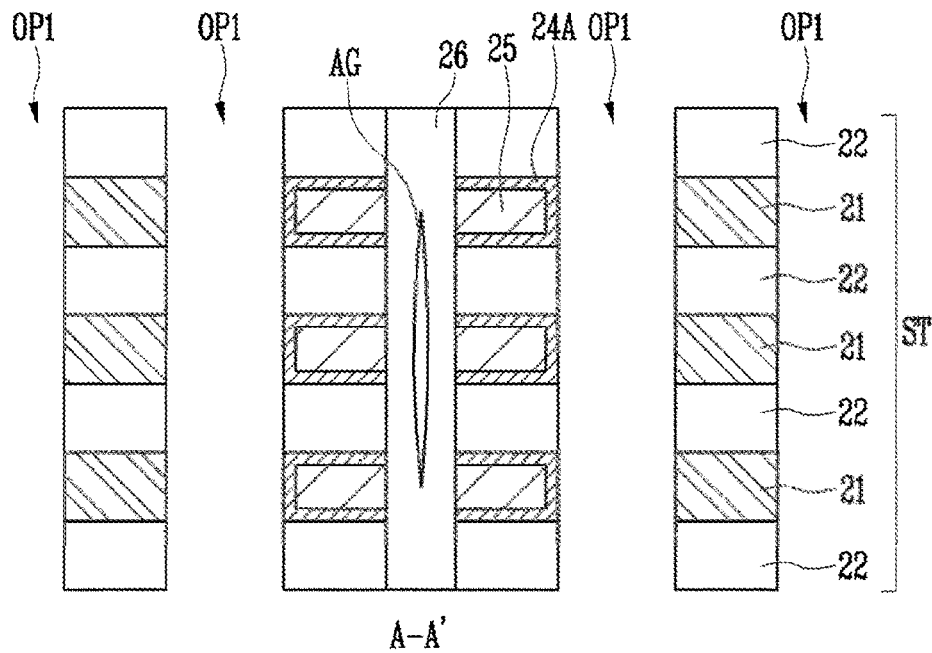
Figure 3D:
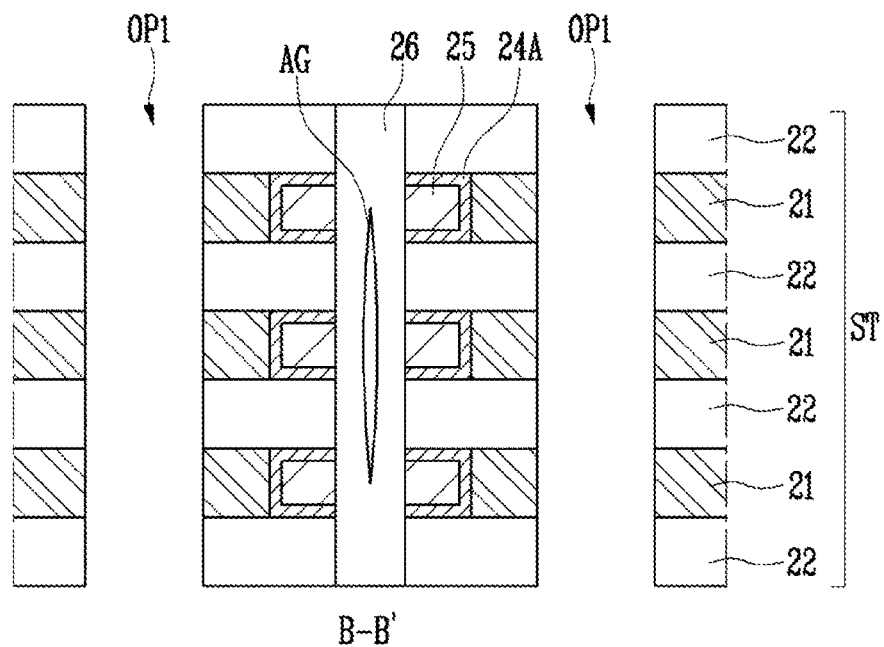

Referring to FIGS. 2D and 3D, the first openings OP1 are re-opened by removing the sacrificial layer 23. For reference, the process of forming the first openings OP1 and the sacrificial layers 23 may be omitted before forming the slit SL, and the first openings OP1 may be formed after forming the slit insulating layer 26.

Figure 2E:
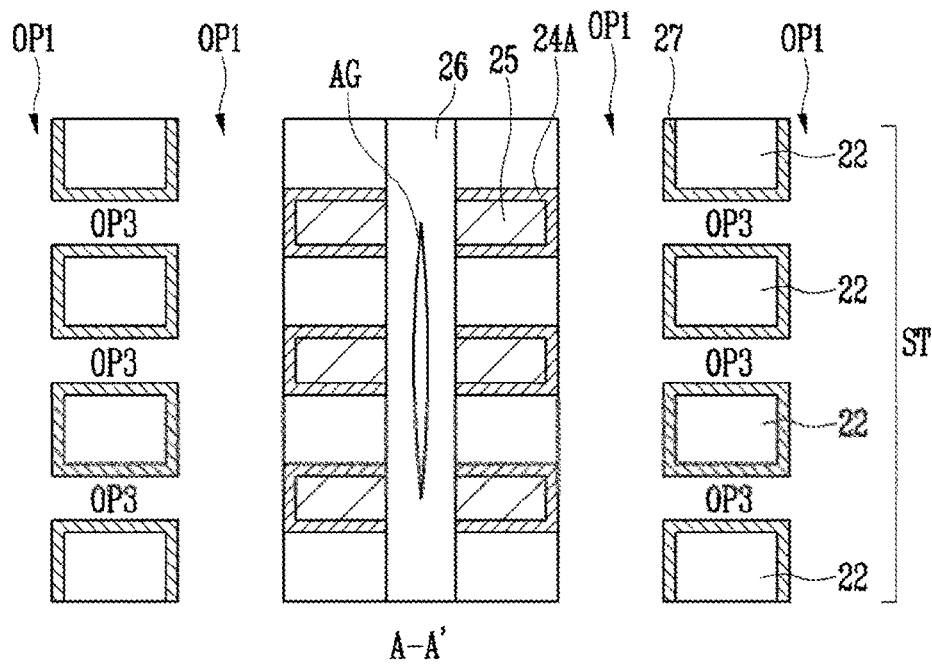
Figure 3E:
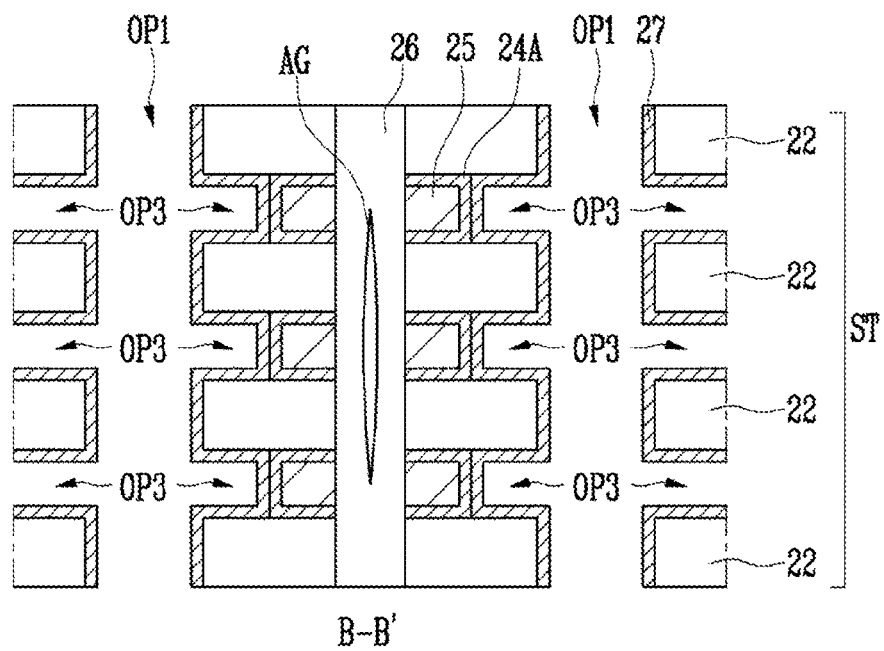

Referring to FIGS. 2E and 3E, third openings OP3 are formed by removing the first material layers 21 exposed through the first openings OP1. In this case, the first barrier patterns 24A or the first metal patterns 25 may be exposed by removing the residual first material layers 21.

Next, second barrier layers 27 are formed along internal surfaces of the first and third openings OP1 and OP3. Here, the second barrier layers 27 may be formed in a thickness, in which the third openings OP3 are not completely filled. Further, the second barrier layers 27 may be formed along the surfaces of the insulating layers 22 and the surfaces of the first barrier patterns 24A exposed through the first and third openings OP1 and OP3. For example, the second barrier layers 27 may include titanium (Ti), a titanium nitride (TiN), tantalum (Ta), a tantalum nitride (TaN), a tungsten nitride (WNx), or a tungsten silicon nitride (WSiN).

Figure 2F:
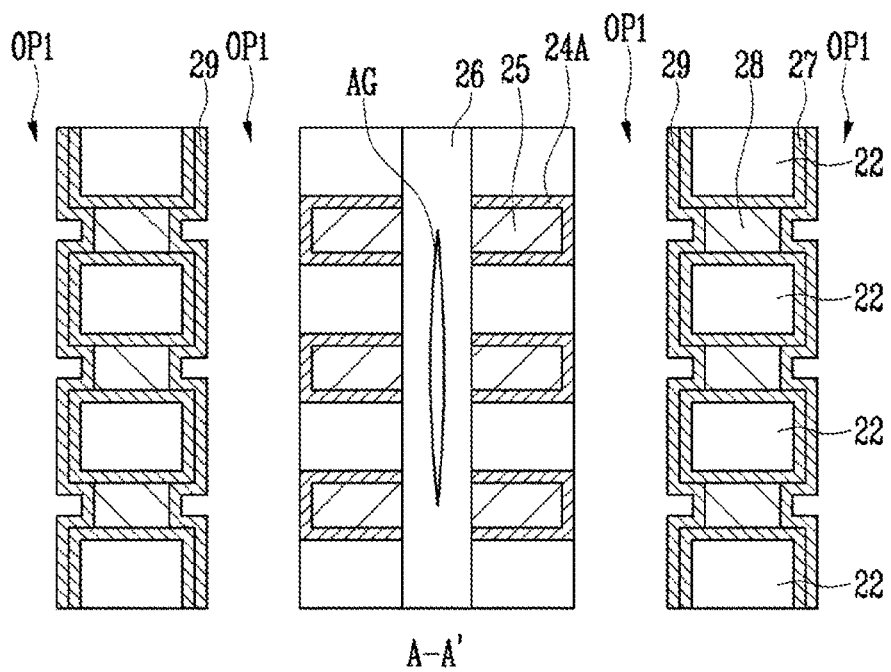
Figure 3F:
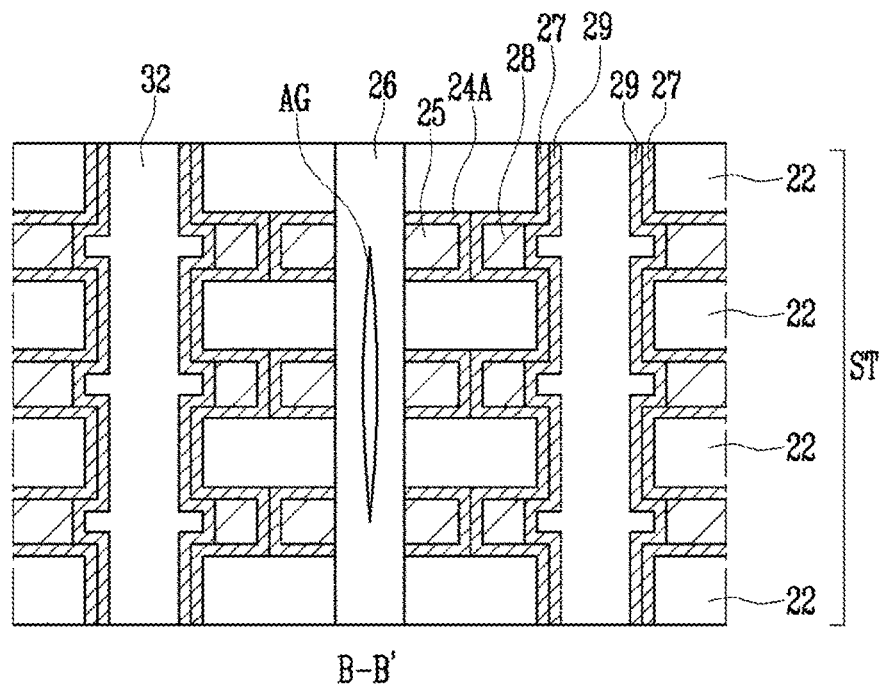

Referring to FIGS. 2F and 3F, second metal patterns 28 are formed within the third openings OP3, respectively. Here, the second metal patterns 28 may include aluminum Al, tungsten W, or copper Cu. Here, a second barrier layer 29 is additionally formed to cover the surfaces of the second metal patterns 28 exposed through the first openings OP1. The additionally formed second barrier layer 29 may be formed along the surfaces of the second barrier layers 27 and the second metal patterns 28 exposed through the first openings OP1 and third openings OP3.

Figure 2G:
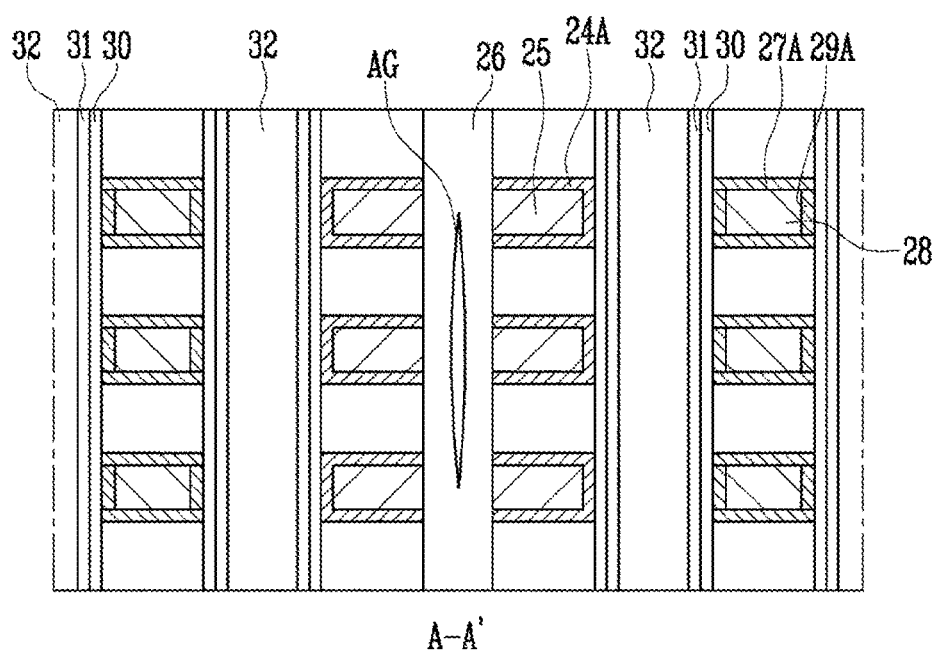
Figure 3G:
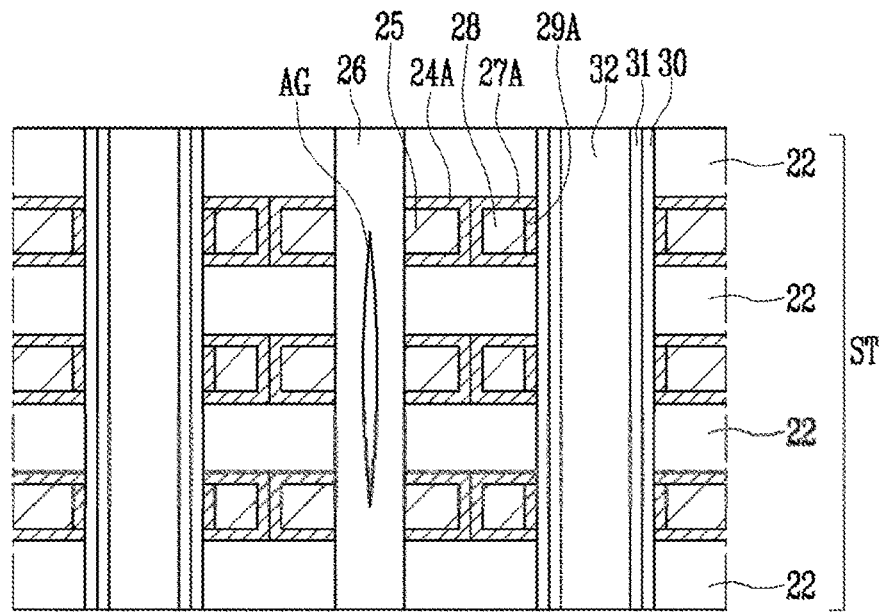

Referring to FIGS. 2G and 3G, second barrier patterns 27A and 29A are formed by removing the second barrier layers 27 and 29 formed within the first openings OP1. For example, the second barrier layers 27 and 29 are etched by a blanket etching process. Accordingly, the second barrier patterns 27A and 29A surrounding the whole surface of the second metal patterns 28 may be formed.

Subsequently, a memory layer 30, a channel layer 31, and a gap-fill insulating layer 32 are sequentially formed within the first openings OP1. The memory layer 30 may include a charge blocking layer, a data storing layer, and a tunnel insulating layer, and the data storing layer may include a floating gate, such as polysilicon, a charge trap material, such as a nitride, a phase change material, a nano dot, and the like.

The memory layer 30 may be in contact with the second barrier pattern 29A. That is, the memory layer 30 is not in direct contact with the second metal pattern 28, and the second barrier pattern 29A is interposed between the memory layer 30 and the second metal pattern 28. Accordingly, it may be possible to improve adhesive force of the memory layer 30 and prevent the memory layer 30 from being degraded.

The channel layer 31 may include a semiconductor material, such as silicon Si, and germanium (Ge). Further, the gap-fill insulating layer 32 may be formed to fill an opened center region of the channel layer 31, and may include an oxide, such as poly silazane (PSZ).

When the first material layer 21 is the first sacrificial layer and the second material layer 22 is the second sacrificial layer, a process of replacing the second material layers 22 with insulating layers may be additionally performed before forming the memory layer 30.

Further, when the second openings OP2 are formed, a layout of the conductive layers C may be changed according to the removal amount of first material layers 21. In the present example of an embodiment, the first material layers 21 are removed so that the sacrificial layers 23 are exposed within the second openings OP2, so that the first metal patterns 25 surround the partial side walls of the channel layers 31 (see the layout of FIG. 1A). When the sacrificial layers 23 are not exposed within the second openings OP2 by decreasing the removal amount of first material layers 21 during the forming of the second openings OP2, the second metal patterns 28 entirely surround the side walls of the channel layers 31 (see the layout of FIG. 1B).

According to an aforementioned process, the first material layers 21 are first replaced with the first metal patterns 25 through the slit SL, and the first material layers 21 are secondly replaced with the second metal patterns 28 through the first openings OP1. When the first material layers 21 are removed only through the slit SL, the first material layers 21 far from the slit SL may not be completely removed, or even though the first material layers 21 far from the slit SL is completely removed, the conductive material may not be completely filled in the corresponding region. By contrast, according to an example of an embodiment of the present disclosure, the first material layers 21 are removed in both directions and the metal materials are filled, so that it may be possible to easily remove the first material layers 21 and easily fill the metal materials. Accordingly, an empty space is not created within the conductive layers C, and reaction gas is not left within the conductive layers C.

FIGS. 4A to 4E are cross-sectional views for describing a method of manufacturing the semiconductor device according to an example of an embodiment of the present disclosure, and may be cross-sectional views taken along line C-C' of FIG. 1B. Hereinafter, contents overlapping the aforementioned description will be omitted.

Figure 4A:
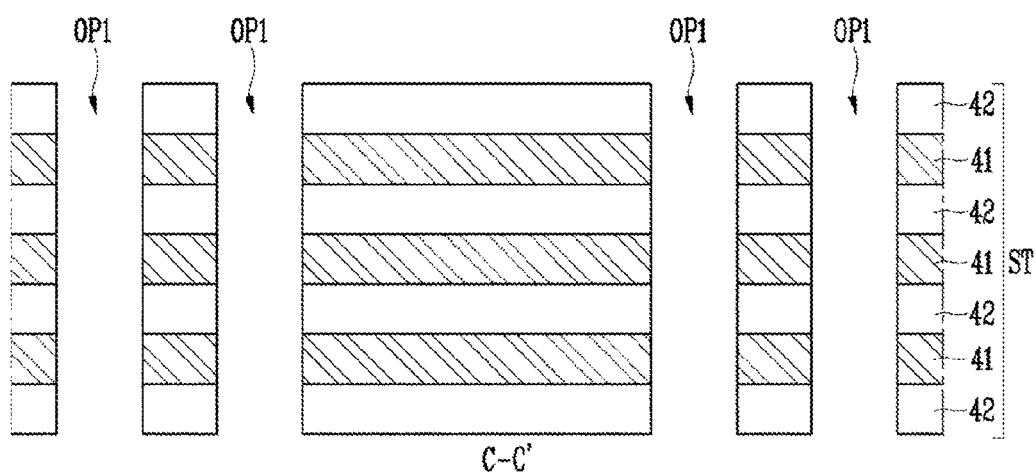
FIGS. 4A to 4E are cross-sectional views for describing a method of manufacturing the semiconductor device according to an example of an embodiment of the present disclosure.

Referring to FIG. 4A, a stacked material ST, in which first material layers 41 and second material layers 42 are alternately stacked, is formed. Next, first openings OP1, which pass through the first and second material layers 41 and 42 and are arranged in the first direction I-I' and the second direction II-II', are formed. The first openings OP1 may be channel holes, and may be formed in depths, in which all of the stacked first material layers 41 are exposed.

Figure 4B:
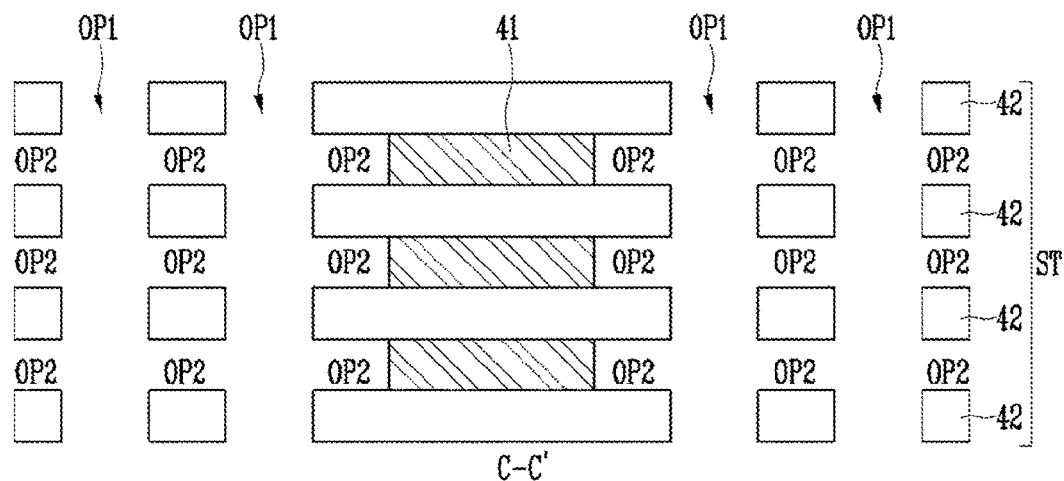

Referring to FIG. 4B, second openings OP2 are formed by partially removing the first material layers 41 exposed through the first openings OP1. In this case, the first material layers 41 may be removed so that the adjacent first openings OP1 are connected to each other through the second openings OP2. However, the first material layers 41 are left in a region, in which a slit is to be formed in a subsequent process.

Figure 4C:
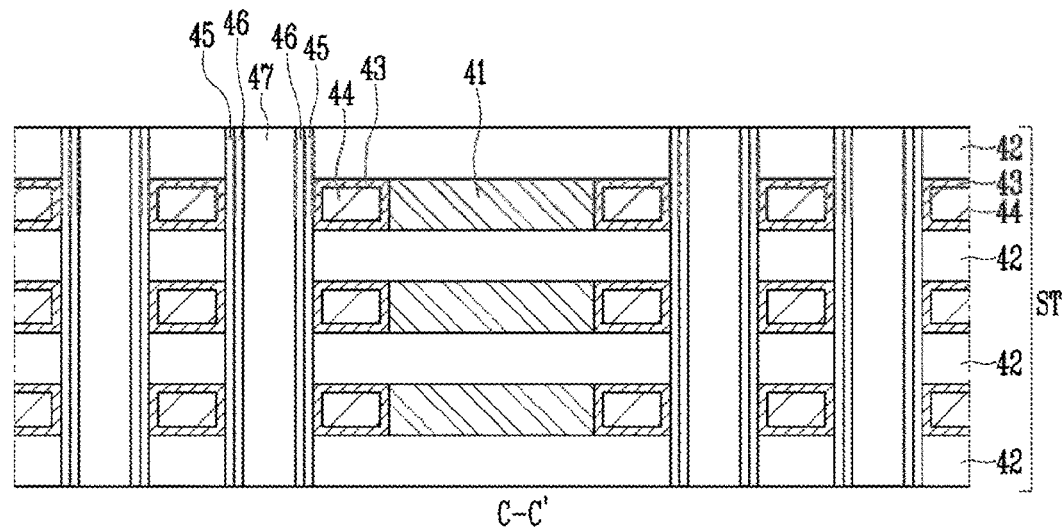

Referring to FIG. 4C, first barrier patterns 43 and first metal patterns 44 are formed within the second openings OP2. Here, the first barrier pattern 43 may be formed to surround a whole surface of the first metal pattern 44. Subsequently, a memory layer 45, a channel layer 46, and a gap-fill insulating layer 47 are sequentially formed within the first openings OP1.

Figure 4D:
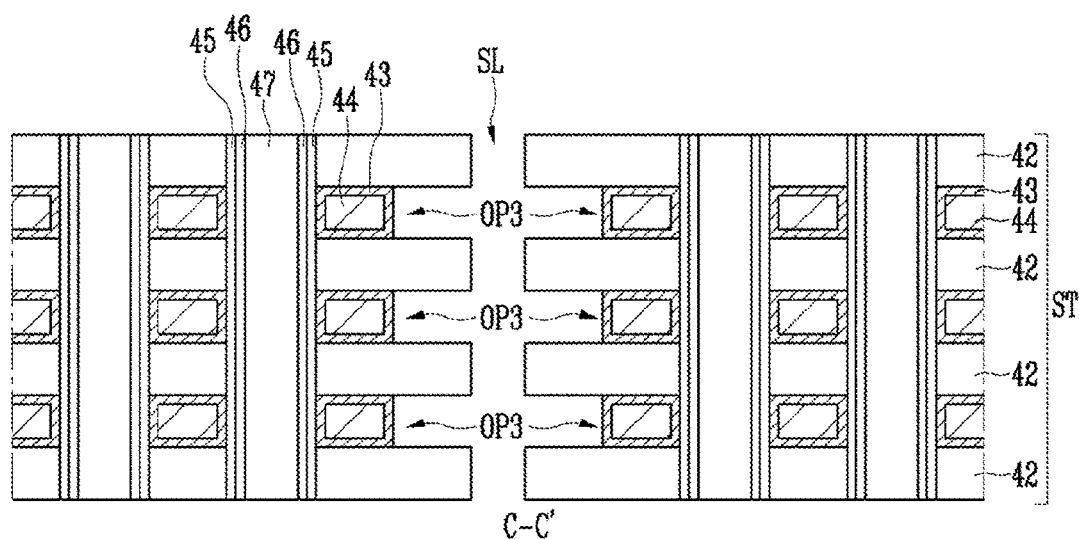

Referring to FIG. 4D, a slit SL passing through the first and second material layers 41 and 42 is formed. Here, the slit SL may be formed in a depth, by which all of the stacked first material layers 41 are exposed. Next, third openings OP3 are formed by removing the remaining first material layers 41 through the slit SL. The first barrier pattern 43 or the first metal pattern 44 is exposed through the third openings OP3.

Figure 4E:
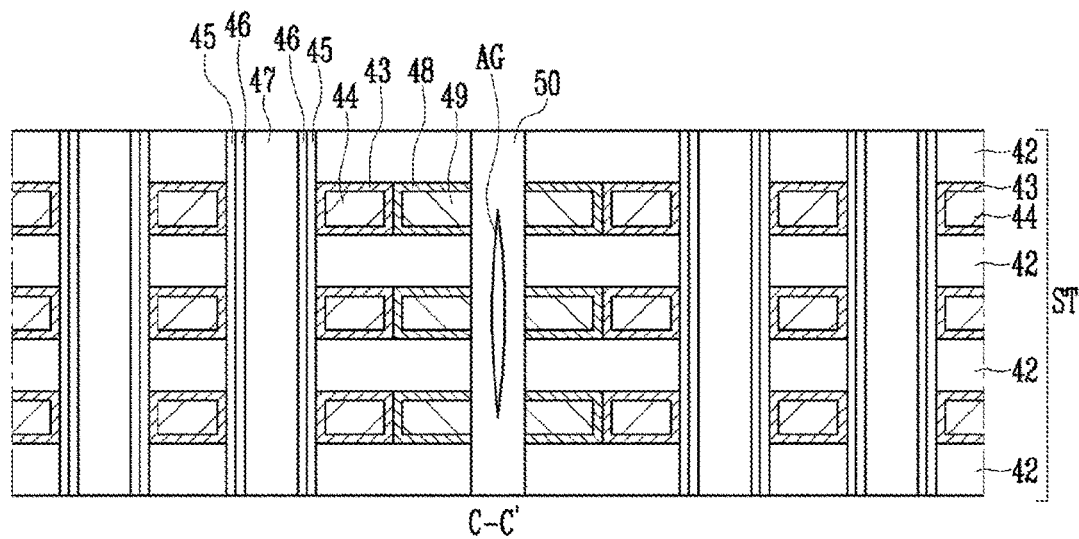

Referring to FIG. 4E, second barrier patterns 48 and second metal patterns 49 are formed within the third openings OP3. Here, the second barrier pattern 48 may be formed to surround the second metal patterns 49 in substantially a form of "C".

Subsequently, a slit insulating layer 50 is formed within the slit SL. The slit insulating layer 50 may include an air gap AG. Further, the slit insulating layer 50 may be in direct contact with the second metal patterns 49.

Figure 5:
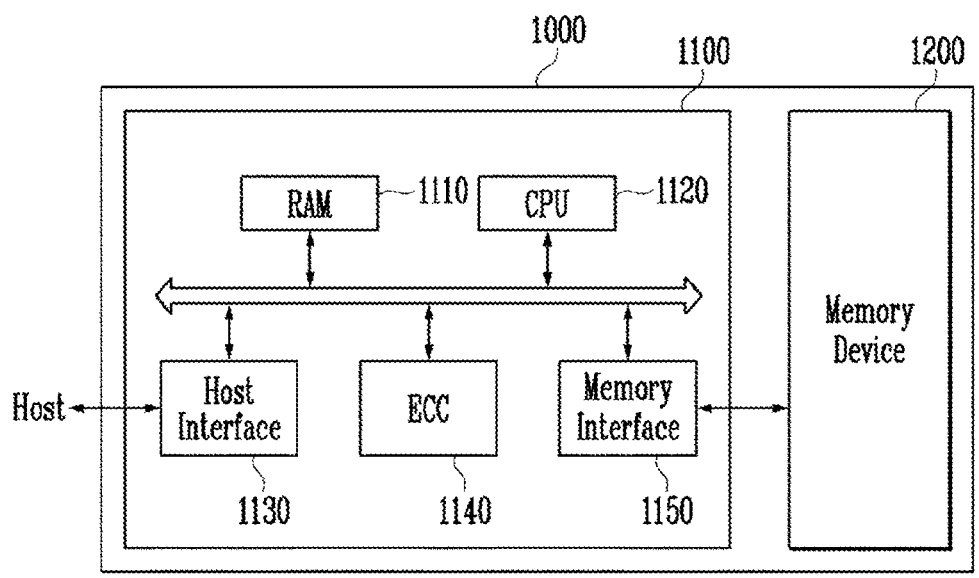
FIGS. 5 and 6 are block diagrams illustrating a configuration of a memory system according to an example of an embodiment of the present disclosure.

FIG. 5 is a block diagram illustrating a configuration of a memory system according to an example of an embodiment of the present disclosure.

Referring to FIG. 5, a memory system 1000 according to an embodiment of the present disclosure includes a memory device 1200 and a controller 1100.

The memory device 1200 is used for storing data information having various data forms, such as text, graphic, and software codes. The memory device 1200 may be a non-volatile memory, and may include the structures described above with reference to FIGS. 1A to 4E. The memory device 1200 may include first channel layers arranged in a first direction. The memory device 1200 may include second channel layers adjacent to the first channel layers in a second direction crossing the first direction and arranged in the first direction. The memory device 1200 may include insulating layers stacked while surrounding side walls of the first and second channel layers. The memory device 1200 may include conductive layers interposed between the insulating layers, and including first metal patterns extended in the first direction while surrounding partial side walls of the second channel layers and second metal patterns extended in the first direction while surrounding the side walls of the first channel layers and the remaining side walls of the second channel layers. A structure and the manufacturing method of the memory device 1200 may include the same as those described above, so that detailed descriptions thereof will be omitted.

The controller 1100 is connected to a host and the memory device 1200, and is configured to access the memory device 1200 in response to a request from the host. For example, the controller 1100 is configured to control read, write, erase, and background operations of the memory device 1200.

The controller 1100 includes a Random Access Memory (RAM) 1100, a Central Processing Unit (CPU) 1120, a host interface 1130, an Error Correction Code (ECC) circuit 1140, a memory interface 1150, and the like.

Here, the RAM 1110 may be used as an operation memory of the CPU 1120, a cache memory between the memory device 1200 and the host, a buffer memory between the memory device 1200 and the host, and the like. For example, the RAM 1100 may be replaced with a Static Random Access Memory (SRAM), a Read Only Memory (ROM), and the like.

The CPU 1120 is configured to control a general operation of the controller 1100. For example, the CPU 1120 is configured to operate firmware, such as a Flash Translation Layer (FTL), stored in the RAM 1110.

The host interface 1130 is configured to perform interfacing with the host. For example, the controller 1100 communicates with the host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, and an Integrated Drive Electronics (IDE) protocol, and a private protocol.

The ECC circuit 1140 is configured to detect and correct an error included in data read from the memory device 1200 by using an ECC.

The memory interface 1150 is configured to perform interfacing with the memory device 1200. For example, the memory interface 1150 includes a NAND interface or a NOR interface.

For example, the controller 1100 may further include a buffer memory (not illustrated) for temporarily storing data. Here, the buffer memory may be used for temporarily storing data transmitted to the outside through the interface 1130, or temporarily storing data transmitted from the memory device 1200 through the memory interface 1150. Further, the controller 1100 may further include an ROM storing code data for interfacing with the host.

As described above, the memory system 1000 according to the examples of embodiments of the present disclosure may include the memory device 1200 having a stable structure and improved loading, thereby also improving a characteristic of the memory system 1000.

Figure 6:
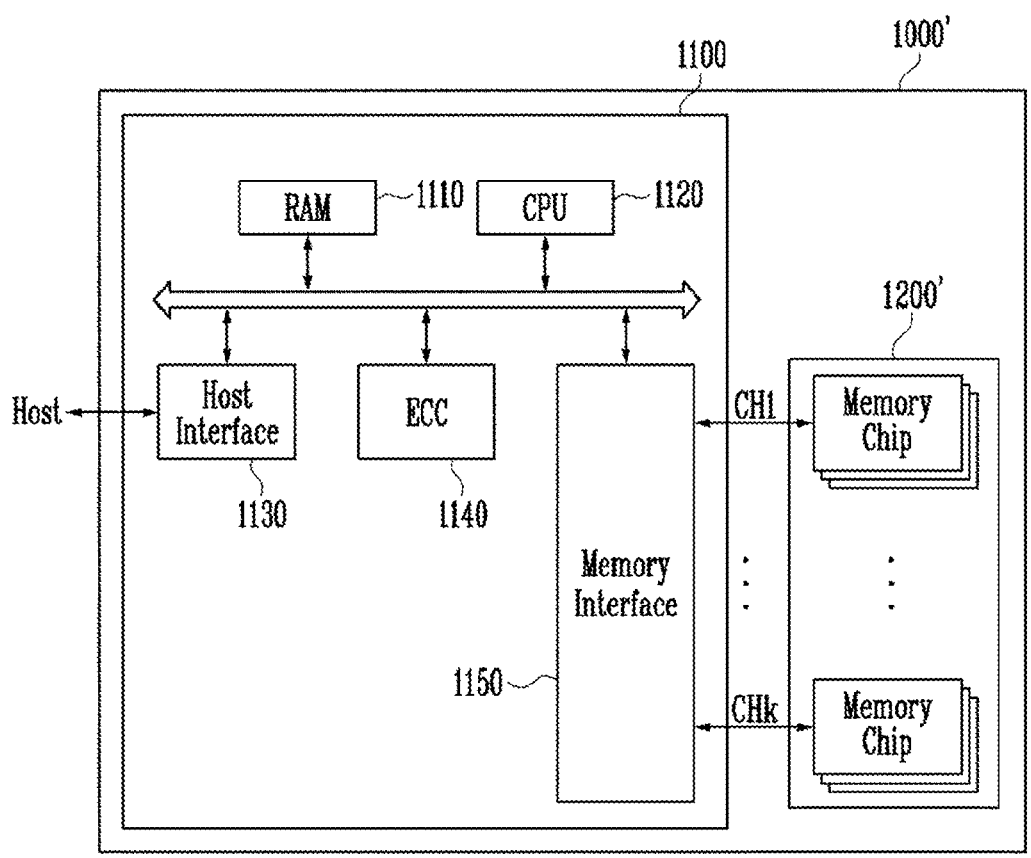

FIG. 6 is a block diagram illustrating a configuration of a memory system according to an example of an embodiment of the present disclosure. Hereinafter, contents overlapping the aforementioned description will be omitted.

As illustrated in FIG. 6, a memory system 1000' according to an example of an embodiment of the present disclosure may include a memory device 1200' and a controller 1100. Further, the controller 1100 includes a RAM 1110, a CPU 1120, a host interface 1130, an ECC circuit 1140, a memory interface 1150, and the like.

The memory device 1200' may be a non-volatile memory, and may include a memory string and/or semiconductor device described above with reference to FIGS. 1A to 4E. Further, the memory device 1200' may include first channel layers arranged in a first direction. The memory device 1200' may include second channel layers adjacent to the first channel layers in a second direction crossing the first direction and arranged in the first direction. The memory device 1200' may include insulating layers stacked while surrounding side walls of the first and second channel layers. The memory device 1200' may include conductive layers interposed between the insulating layers, and including first metal patterns extended in the first direction while surrounding partial side walls of the second channel layers and second metal patterns extended in the first direction while surrounding the side walls of the first channel layers and the remaining side walls of the second channel layers. A structure and the manufacturing methods of the memory device 1200' include the same as those described above, so that detailed descriptions thereof will be omitted.

The memory device 1200' may be a multi-chip package formed of a plurality of memory chips. The plurality of memory chips is divided into a plurality of groups, and the plurality of groups is configured to communicate with the controller 1100 through first to k$^{th}$ channels CH1 to CHk. The memory chips included in one group are configured to communicate with the controller 1100 through a common channel. For example, the memory system 1000' may be modified so that one memory chip is connected to one channel.

As described above, the memory system 1000' according to the examples of embodiments of the present disclosure may include the memory device 1200' having a stable structure and improved loading, thereby also improving a characteristic of the memory system 1000'. Particularly, the memory device 1200' is formed in the multi-chip package, so that it may be possible to increase a data storage capacity of the memory system 1000' and improve a driving speed.

Figure 7:
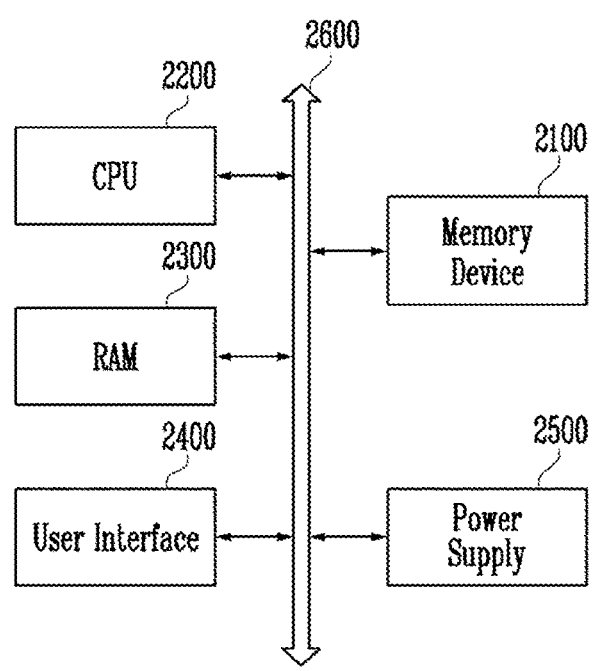
FIGS. 7 and 8 are block diagrams illustrating a configuration of a computing system according to an example of an embodiment of the present disclosure.

FIG. 7 is a block diagram illustrating a configuration of a computing system according to an example of an embodiment of the present disclosure. Hereinafter, contents overlapping the aforementioned description will be omitted.

As illustrated in FIG. 7, a computing system 2000 according to an example of an embodiment of the present disclosure may include a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. The memory device 2100 is electrically connected to the CPU 2200, the RAM 2300, the user interface 2400, and the power supply 2500 through the system bus 2600. For example, the memory device 2100 may be connected to the system bus 2600 through a controller (not illustrated), or may be directly connected to the system bus 2600. When the memory device 2100 is directly connected to the system bus 2600, a function of the controller may be performed by the CPU 2200, the RAM 2300, and the like.

Here, the memory device 2100 may be a non-volatile memory, and may include a memory string and or semiconductor device described above with reference to FIGS. 1A to 4E. The memory device 2100 may include first channel layers arranged in a first direction. The memory device 2100 may include second channel layers adjacent to the first channel layers in a second direction crossing the first direction and arranged in the first direction. The memory device 2100 may include insulating layers stacked while surrounding side walls of the first and second channel layers. The memory device 2100 may include conductive layers interposed between the insulating layers, and including first metal patterns extended in the first direction while surrounding partial side walls of the second channel layers and second metal patterns extended in the first direction while surrounding side walls of the first channel layers and the remaining side walls of the second channel layers. A structure and the manufacturing method of the memory device 2100 include the same as those described above, so that detailed descriptions thereof will be omitted.

Further, the memory device 2100 may be a multi-chip package formed of a plurality of memory chips as described above with reference to FIG. 6.

The computing system 2000 including the aforementioned configuration may include a computer, an Ultra Mobile PC (UMPC), a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3D television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, and the like.

As described above, the computing system 2000 according to an example of an embodiment of the present disclosure may include the memory device 2100 having a stable structure and improved loading, thereby also improving a characteristic of the computing system 2000.

Figure 8:
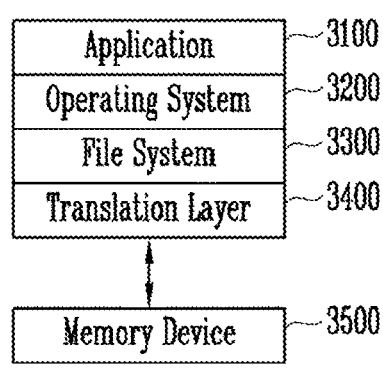

FIG. 8 is a block diagram illustrating a computing system according to an example of an embodiment of the present disclosure.

Referring to FIG. 8, a computing system 3000 according to an example of an embodiment of the present disclosure includes a software layer including an operating system 3200, an application 3100, a file system 3300, a translation layer 3400, and the like. Further, the computing system 3000 includes a hardware layer, such as a memory device 3500.

The operating system 3200 is provided for managing software and hardware sources, and the like of the computing system 3000, and may control an execution of a program of a CPU. The application 3100 is various application programs executed in the computing system 3000, and may be a utility executed by the operation system 3200.

The file system 3300 means a logical structure for managing data, a file, and the like present in the computing system 3000, and organizes a file or data to be stored in the memory device 3500 and the like according to a rule. The file system 3300 may be determined by the operation system 3200 used in the computing system 3000. For example, when the operation system 3200 is a series of Windows of the Microsoft Company, the file system 3300 may be a File Allocation Table (FAT), a NT file system (NTFS), and the like. Further, when the operation system 3200 is a series of Unix/Linux, the file system 3300 may be an Extended File System (EXT), a Unix File System (UFS), a Journaling File System (JFS), and the like.

In the present drawing, the operation system 3200, the application 3100, and the file system 3300 are illustrated as separate blocks, but the application 3100 and the file system 3300 may be included in the operation system 3200.

The translation layer 3400 translates an address into a form appropriate to the memory device 3500 in response to a request from the file system 3300. For example, the translation layer 3400 translates a logic address generated by the file system 3300 into a physical address of the memory device 3500. Here, mapping information of the logic address and the physical address may be stored in an address translation table. For example, the translation layer 3400 may be a Flash Translation Layer (FTL), a Universal Flash Storage Link Layer (ULL), and the like.

The memory device 3500 may be a non-volatile memory, and may include a memory string and or semiconductor device described above with reference to FIGS. 1A to 4E. Further, the memory device 3500 may include first channel layers arranged in a first direction. The memory device 3500 may include second channel layers adjacent to the first channel layers in a second direction crossing the first direction and arranged in the first direction. The memory device 3500 may include insulating layers stacked while surrounding side walls of the first and second channel layers. The memory device 3500 may include conductive layers interposed between the insulating layers, and including first metal patterns extended in the first direction while surrounding partial side walls of the second channel layers and second metal patterns extended in the first direction while surrounding side walls of the first channel layers and the remaining side walls of the second channel layers. A structure and the manufacturing method of the memory device 3500 include same as those described above, so that detailed descriptions thereof will be omitted.

The computing system 3000 including the aforementioned configuration may be divided into an operation system layer performed in a high level region and a controller layer performed in a low level region. Here, the application 3100, the operation system 3200, and the file system 3300 are included in the operation system layer, and may be driven by an operation memory of the computing system 300. Further, the translation layer 3400 may be included in the operation system layer or the controller layer.

As described above, the computing system 3000 according to an example of an embodiment of the present disclosure may include the memory device 3500 having a stable structure and improved loading, thereby also improving a characteristic of the computing system 3000.

The technical spirit of the present disclosure have been described according to the examples of the embodiments, but the examples of the embodiments have been described herein for purposes of illustration and do not limit the present disclosure. Further, those skilled in the art will appreciate that various examples of the embodiments may be made within the technical spirit of the present disclosure.

What is claimed is:

1. A method of manufacturing a semiconductor device, comprising:
   alternately forming first material layers and second material layers;
   forming first openings passing through the first and second material layers, and arranged in a first direction and a second direction crossing the first direction;
   forming a sacrificial layer within the first openings;
   forming a slit passing through the first and second material layers and extended in the first direction;
   forming second openings by removing the first material layers through the slit; and
   forming first metal patterns for gate electrodes within the second openings;
   forming third openings by removing the first material layers through the first openings;
   forming second metal patterns for gate electrodes within the third openings, respectively;
   forming memory layers within the first openings; and
   forming channel layers within the memory layers.

2. The method of claim 1, further comprising: forming first barrier patterns surrounding a whole surface of the second metal patterns, respectively.

3. The method of claim 2, wherein the first barrier patterns include at least one of titanium (Ti), a titanium nitride (TiN), tantalum (Ta), a tantalum nitride (TaN), a tungsten nitride (WNx), or a tungsten silicon nitride (WSiN).

4. The method of claim 1,
   wherein the third openings are formed to expose the sacrificial layer .

5. The method of claim 1,
   wherein the second openings are formed by partially removing the first material layers.

6. The method of claim 5, wherein the forming of the second openings only partially removes the first material layers to prevent exposure of the sacrificial layer.

7. The method of claim 5, further comprising:
   forming second barrier patterns within the second openings before the forming of the first metal patterns.

8. The method of claim 7, wherein the second barrier patterns include at least one of titanium (Ti), a titanium nitride (TiN), tantalum (Ta), a tantalum nitride (TaN), a tungsten nitride (WNx), or a tungsten silicon nitride (WSiN).

9. The method of claim 7, wherein each of the second barrier patterns surrounds each of the first metal patterns, and is interposed between corresponding first metal pattern and the second material layers and between the corresponding first metal pattern and corresponding channel layer.

10. The method of claim 7, wherein the second barrier patterns surround a side wall, an upper surface, and a lower surface of the first metal patterns, respectively.

11. The method of claim 5, further comprising:
forming a slit insulating layer within the slit after the forming of the first metal patterns.

12. The method of claim 1, wherein the first metal patterns include aluminum (Al), tungsten (W), or copper (Cu).

13. The method of claim 1, wherein the first material layers have a higher etch selectivity than the second material layers.

14. A method of manufacturing a semiconductor device, comprising
alternately forming first material layers and second material layers;
forming first openings passing through the first and second material layers, and arranged in a first direction and a second direction crossing the first direction;
forming second openings by removing the first material layers through the first openings;
forming first metal patterns for gate electrodes within the second openings, respectively;
forming memory layers within the first openings;
forming channel layers within the memory layers;
forming a slit passing through the first and second material layers and extended in the first direction;
forming third openings by removing the remaining first material layers through the slit; and
forming second metal patterns for gate electrodes within the third openings.

15. The method of claim 14, further comprising:
forming second barrier patterns within the third openings before the forming of the second metal patterns.

16. The method of claim 15, wherein the second barrier patterns include titanium (Ti), a titanium nitride (TiN), tantalum (Ta), a tantalum nitride (TaN), a tungsten nitride (WNx), or a tungsten silicon nitride (WSiN).

17. The method of claim 15, wherein each of the second barrier patterns surrounds each of the second metal patterns, and is interposed between a corresponding second metal pattern and the second material layers and between the corresponding second metal pattern and a corresponding channel layer.

18. The method of claim 15, wherein the second barrier patterns surround a side wall, an upper surface, and a lower surface of the second metal patterns, respectively.

19. The method of claim 14, further comprising:
forming a slit insulating layer within the slit after the forming of the second metal patterns.

20. A method of manufacturing a semiconductor device, comprising:
alternately forming first material layers and second material layers;
forming channel holes passing through the first and second material layers;
forming a sacrificial layer within the channel holes;
forming a slit passing through the first and second material layers;
forming first openings by removing the first material layers through the slit to expose the sacrificial layer; and
forming first gate electrodes within the first openings;
forming second openings by removing the first material layers through the channel holes;
forming second gate electrodes within the second openings, respectively;
forming memory layers within the channel holes; and
forming channel layers within the channel holes where the memory layers are formed.

* * * * *